United States Patent
Lee

(10) Patent No.: US 9,269,819 B2
(45) Date of Patent: Feb. 23, 2016

(54) SEMICONDUCTOR DEVICE HAVING A GATE AND A CONDUCTIVE LINE IN A PILLAR PATTERN

(75) Inventor: Yu Jun Lee, Yangsan-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 13/538,877

(22) Filed: Jun. 29, 2012

(65) Prior Publication Data

US 2013/0207181 A1    Aug. 15, 2013

(30) Foreign Application Priority Data

Feb. 15, 2012  (KR) .................. 10-2012-0015521

(51) Int. Cl.
*H01L 29/78* (2006.01)
*H01L 29/786* (2006.01)
*H01L 29/66* (2006.01)

(52) U.S. Cl.
CPC .... *H01L 29/78642* (2013.01); *H01L 29/66742* (2013.01)

(58) Field of Classification Search
CPC ..................................................... H01L 29/78
USPC ........................................... 257/329, E29.262
See application file for complete search history.

(56) References Cited

U.S. PATENT DOCUMENTS

| 2005/0032313 | A1* | 2/2005 | Forbes ........................ 438/270 |
| 2007/0051994 | A1* | 3/2007 | Song et al. .................. 257/296 |
| 2010/0013005 | A1* | 1/2010 | Roesner et al. .............. 257/329 |
| 2010/0025757 | A1* | 2/2010 | Son et al. ..................... 257/329 |
| 2011/0284939 | A1* | 11/2011 | Chung et al. ................. 257/296 |
| 2012/0007171 | A1* | 1/2012 | Kim et al. .................... 257/330 |
| 2012/0012922 | A1* | 1/2012 | Jang ............................. 257/329 |
| 2012/0081977 | A1* | 4/2012 | Widjaja et al. ......... 365/189.011 |

FOREIGN PATENT DOCUMENTS

KR    2012-0126720    11/2012

* cited by examiner

*Primary Examiner* — Jerome Jackson, Jr.
*Assistant Examiner* — Lamont Koo

(57) ABSTRACT

A semiconductor device including a vertical gate and a method for manufacturing the same are disclosed, which prevent a floating body phenomenon, thereby increasing a cell threshold voltage and reducing leakage current, resulting in improved refresh properties of the semiconductor device. The semiconductor device includes a plurality of pillar patterns, including first pillar patterns arranged along a first direction and second pillar patterns arranged along a second direction, formed over a semiconductor substrate; a gate extending in the first direction, arranged along sidewalls of the first pillar patterns, and configured to couple the first pillar patterns; a junction region formed in an upper portion of the pillar patterns; and a conductive line arranged along the sidewalls of the first pillar patterns and provided in a region disposed below the junction region and over the gate.

13 Claims, 18 Drawing Sheets

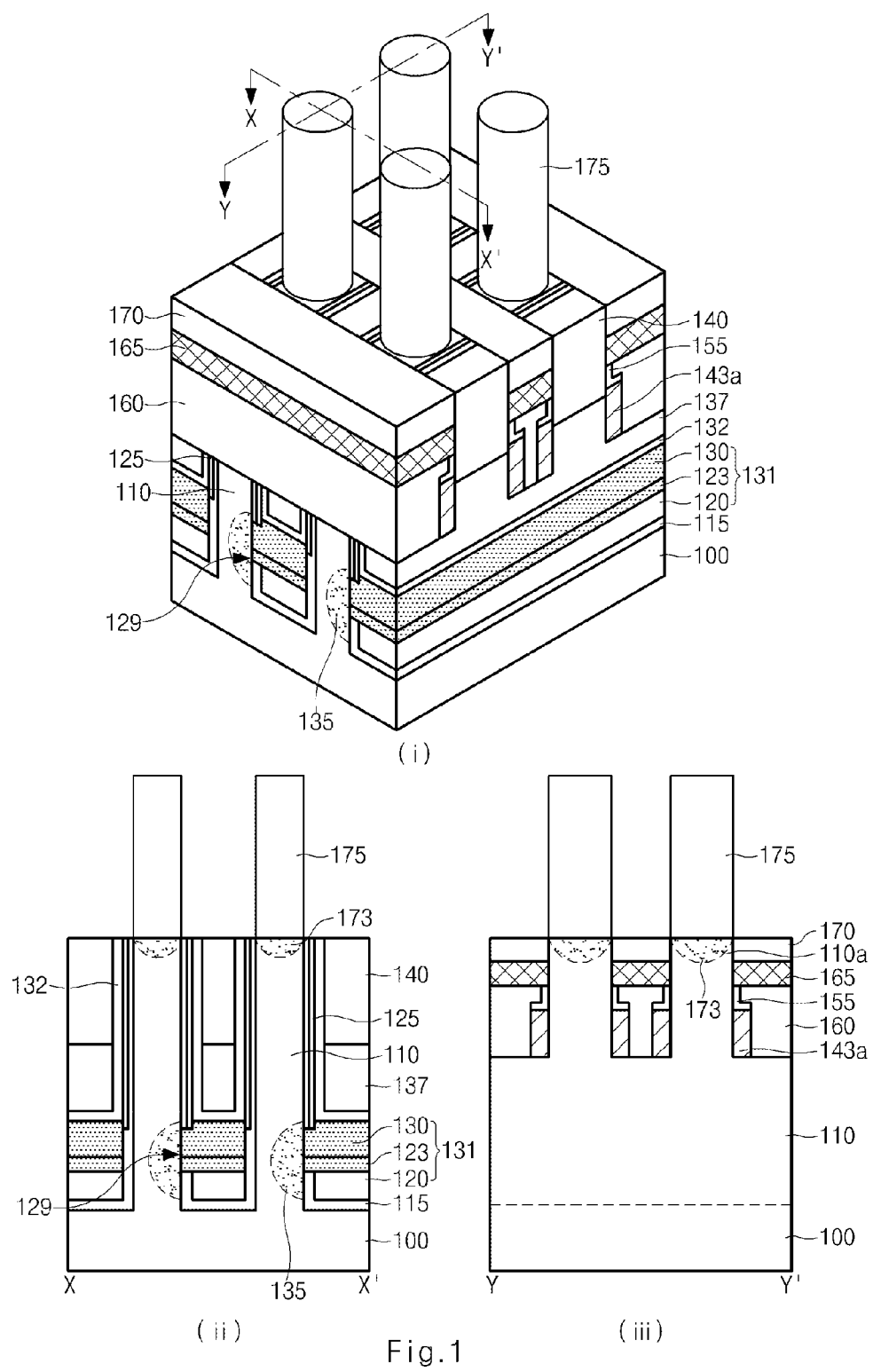

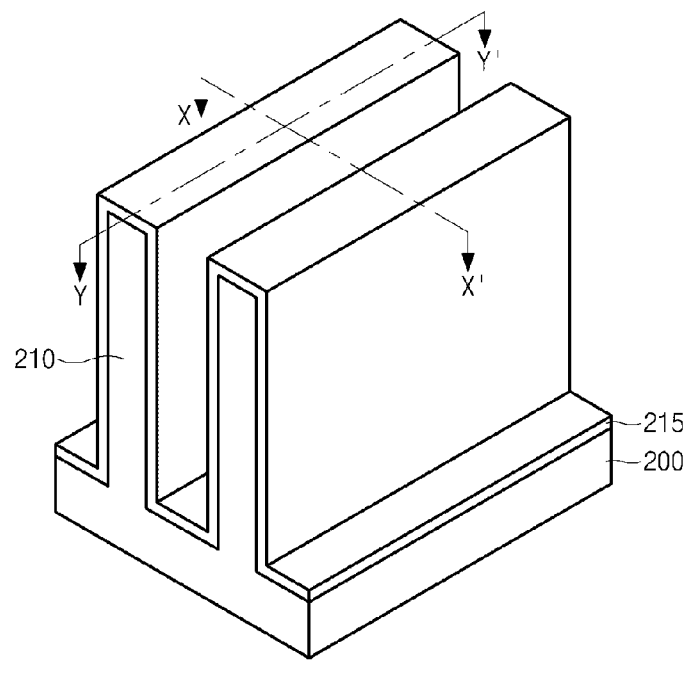
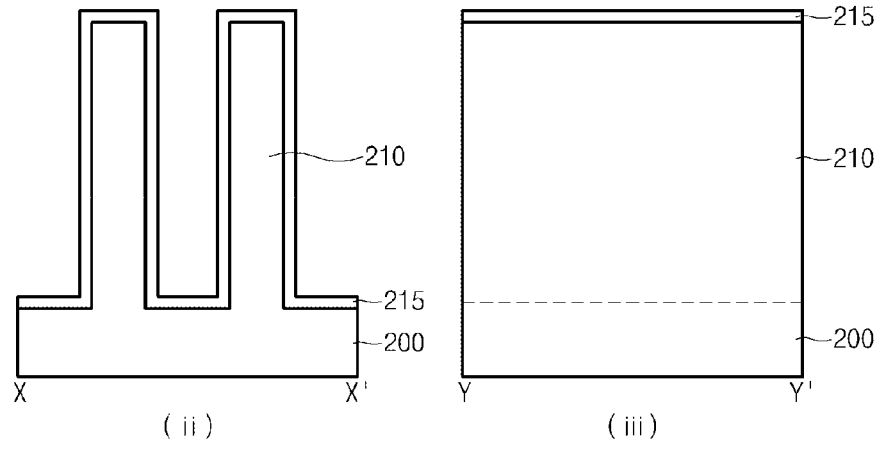
Fig.2A

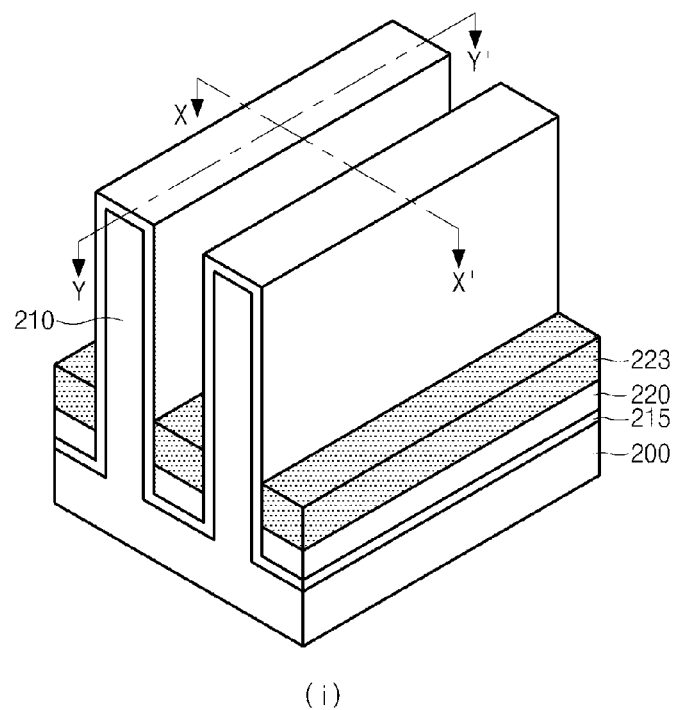
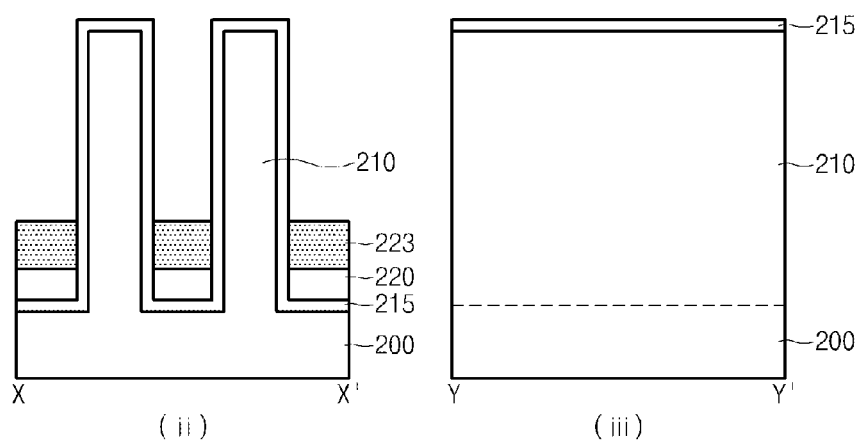
Fig.2B

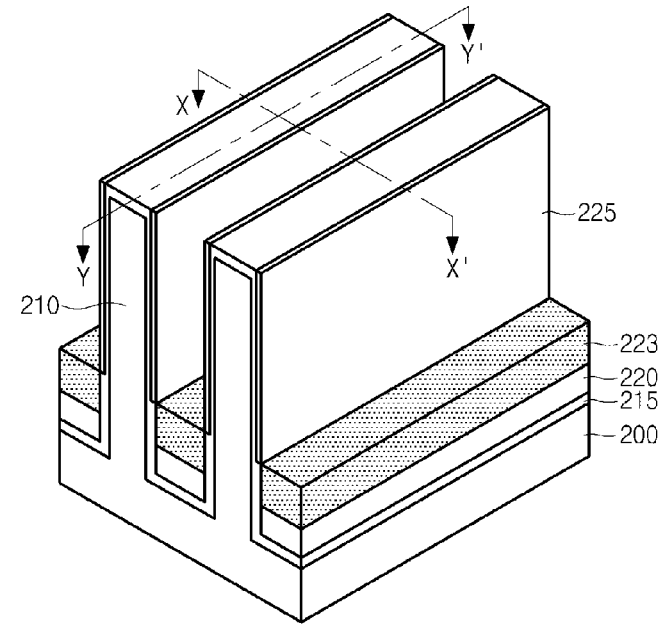
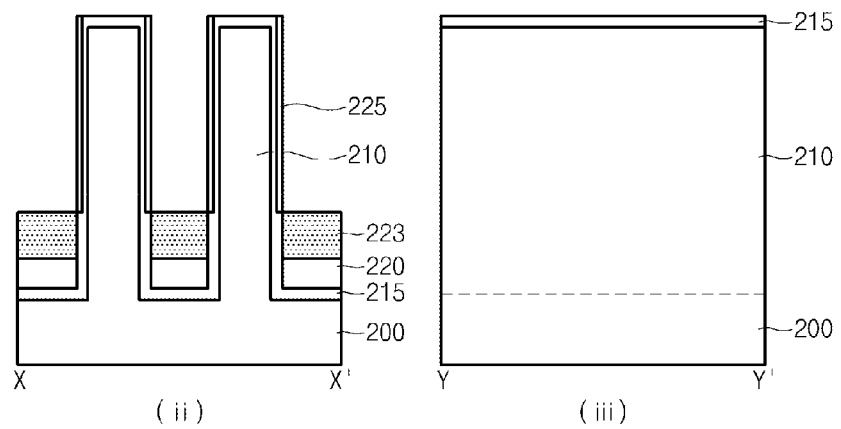
Fig. 2C

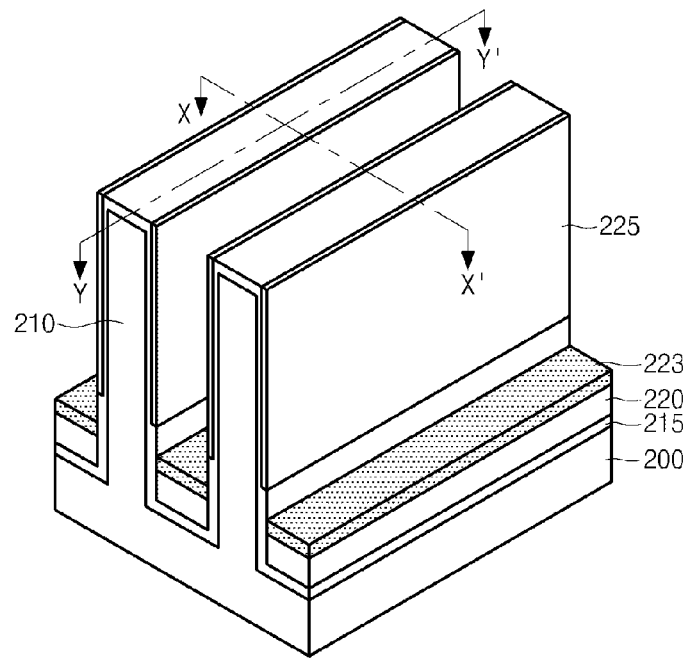
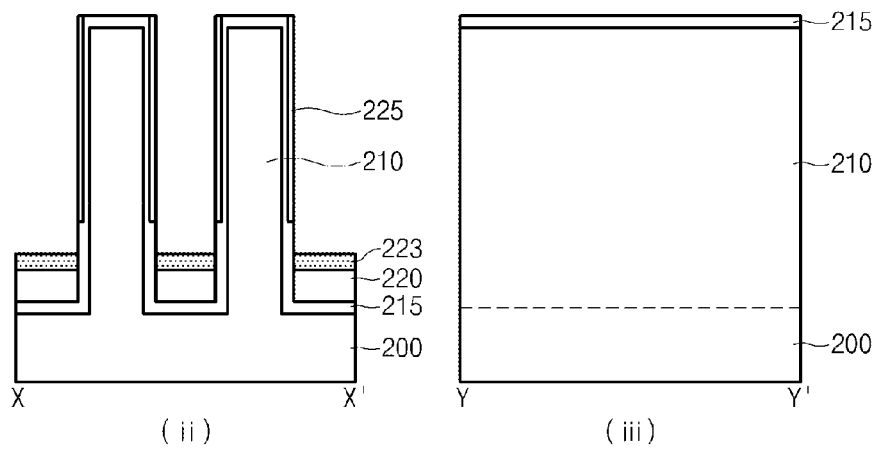
Fig. 2D

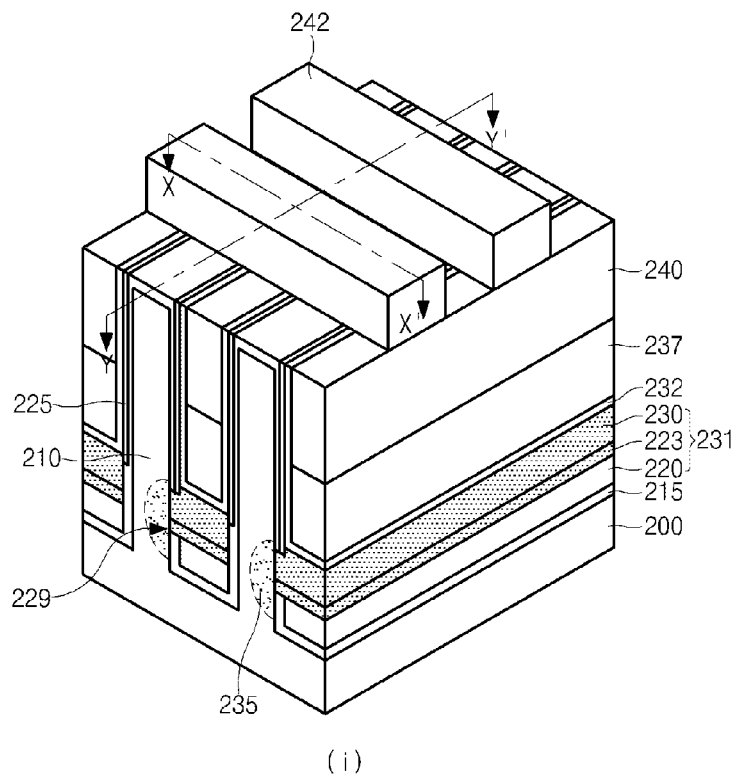
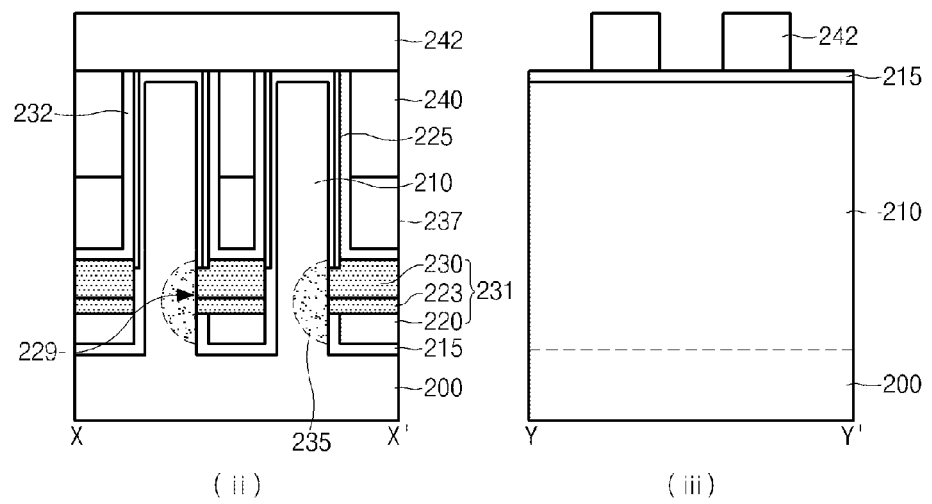
Fig. 2G

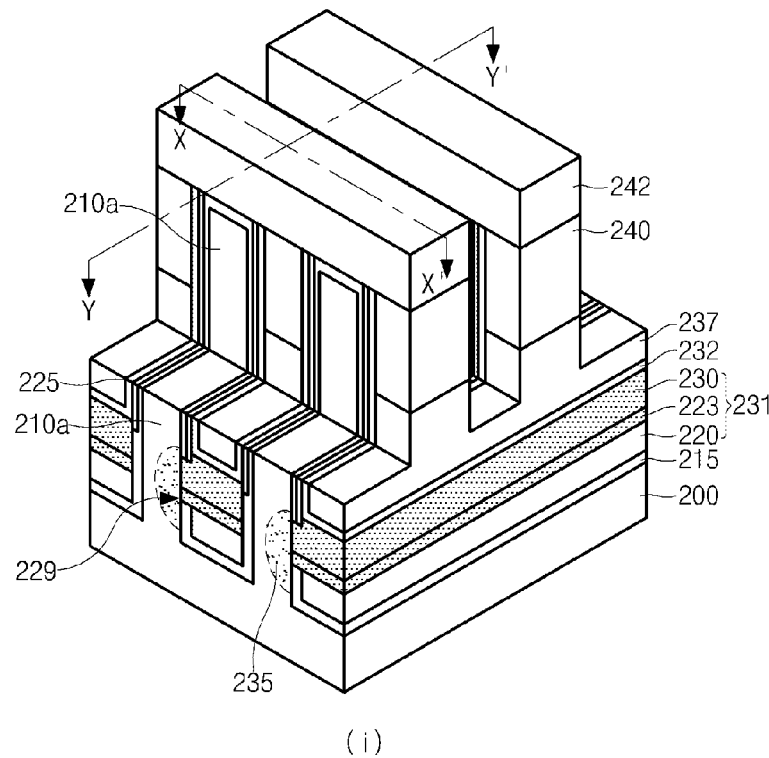
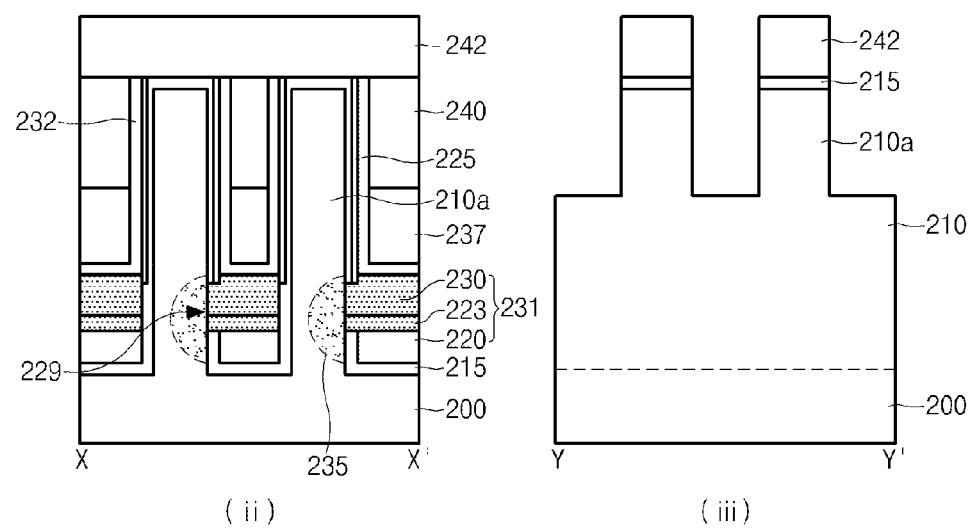
Fig.2H

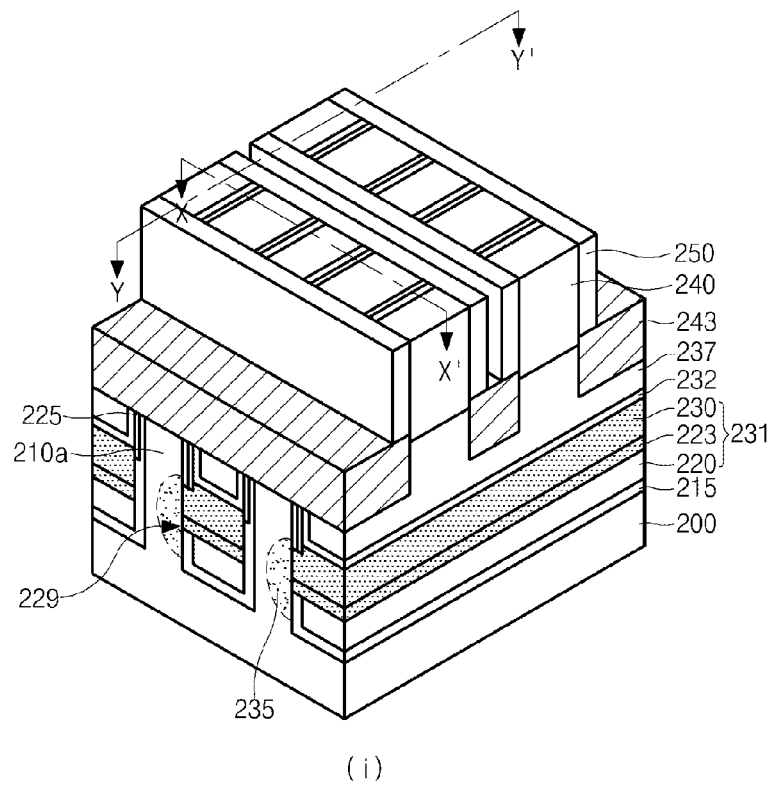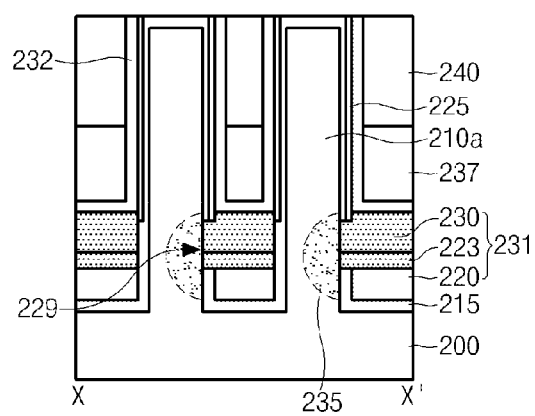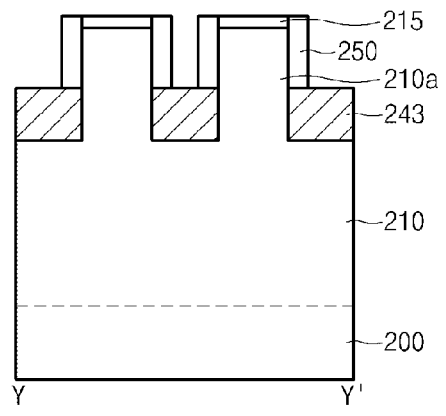
Fig.2J

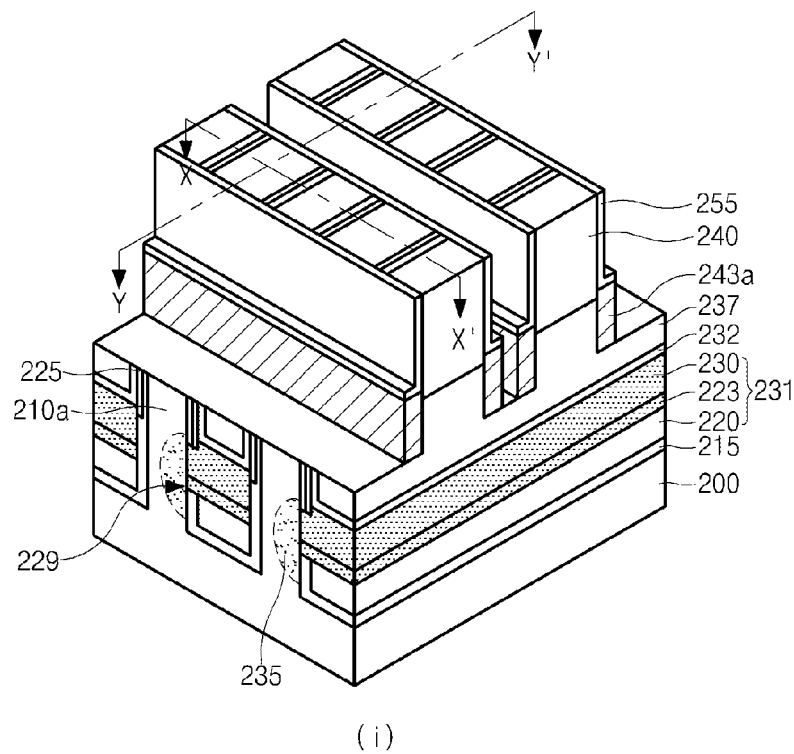
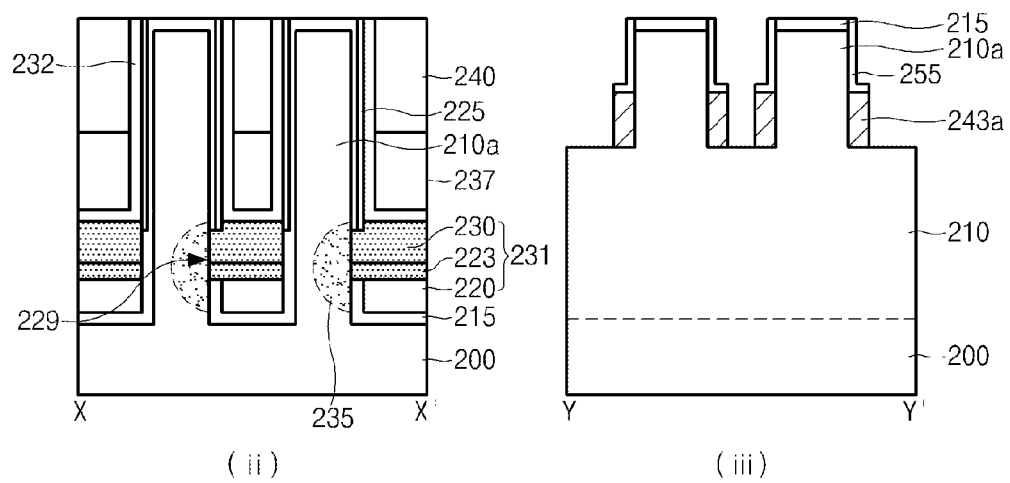
Fig. 2K

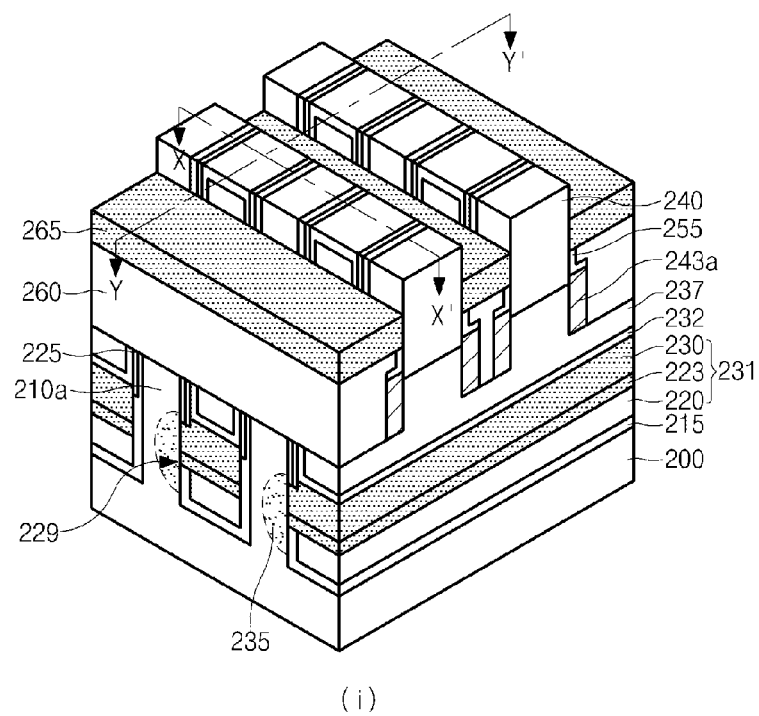
(i)
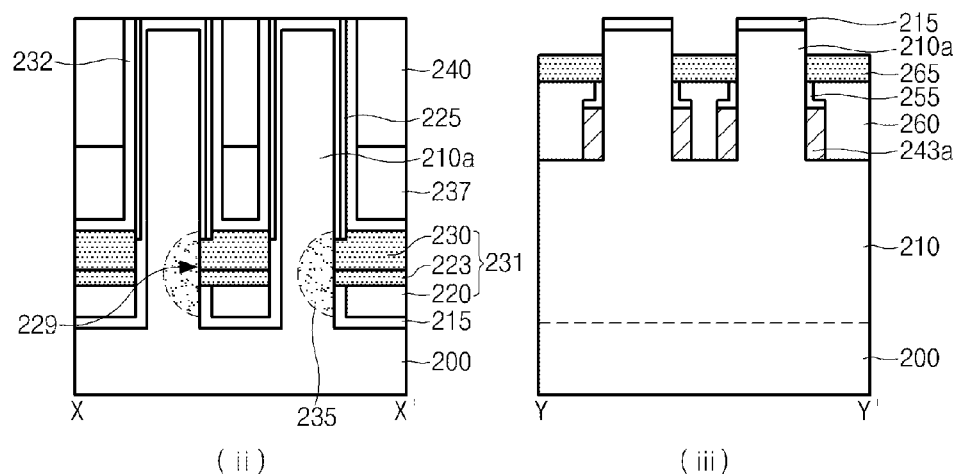
(ii) (iii)
Fig.20

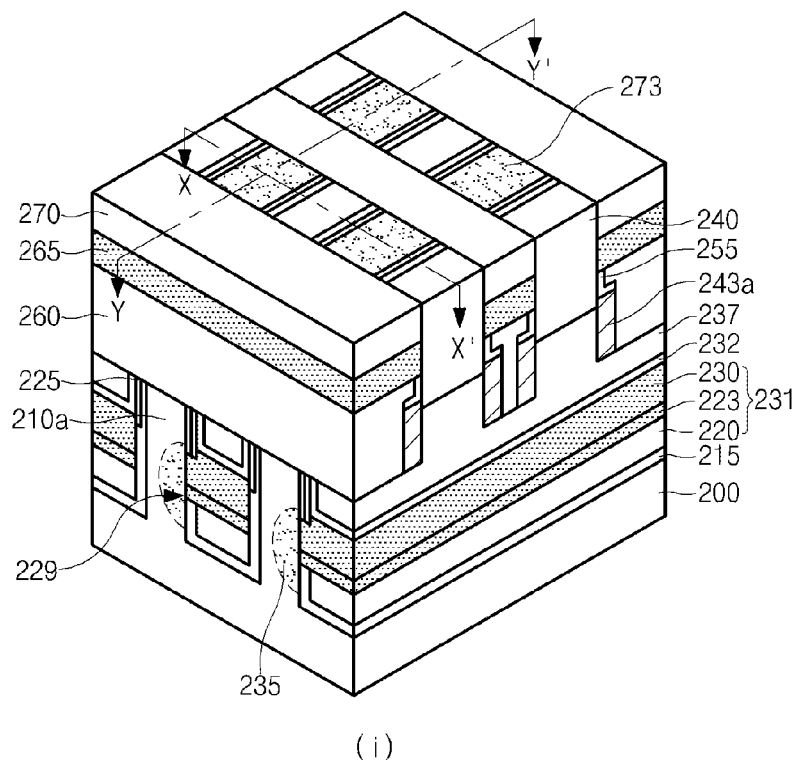
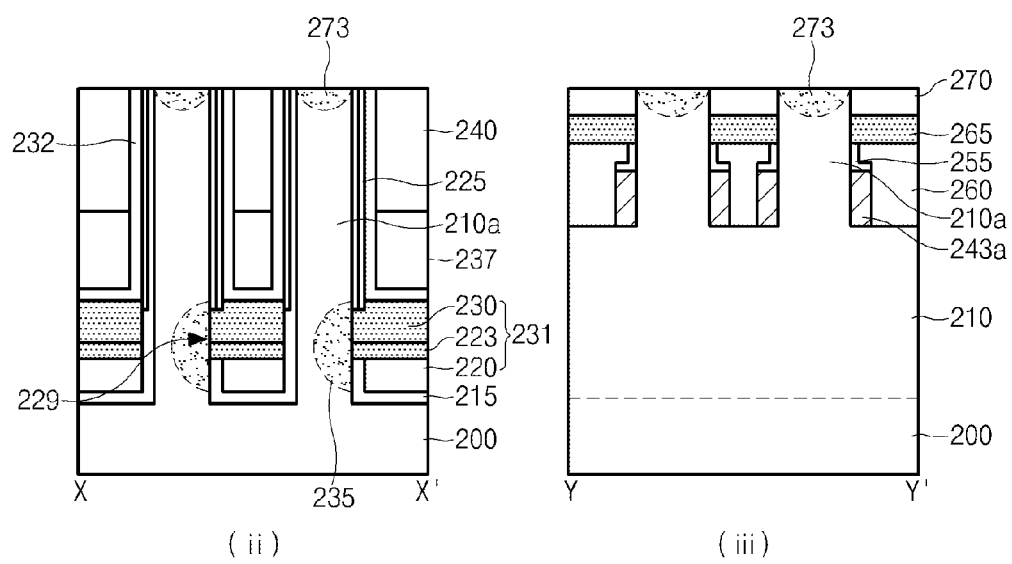
Fig.2P

SEMICONDUCTOR DEVICE HAVING A GATE AND A CONDUCTIVE LINE IN A PILLAR PATTERN

CROSS-REFERENCE TO RELATED APPLICATION

The priority of Korean patent application No. 10-2012-0015521 filed on 15 Feb. 2012, the disclosure of which is hereby incorporated in its entirety by reference, is claimed.

BACKGROUND OF THE INVENTION

Embodiments of the present invention relate to a semiconductor device and a method for manufacturing the same, and more particularly to a semiconductor device including a vertical gate and a method for manufacturing the same.

As the integration degree of a semiconductor device increases, the channel length of a transistor gradually decreases. However, the reduction in channel length of the transistor may result in a Drain Induced Barrier Lowering (DIBL) phenomenon, a hot carrier effect, and other short channel effects, such as punch-through. In order to solve such problems, a variety of methods have been proposed, including for example, a method for reducing the depth of a junction region, a method for increasing channel length by forming a recess in the channel region of a transistor, and the like.

However, as the integration density of a semiconductor memory device, and more particularly, of a Dynamic Random Access Memory (DRAM), approaches Gigabits, it is necessary to manufacture a smaller-sized transistor. That is, a transistor of a gigabyte DRAM device requires a cell area of 8F2 or less (F: minimum feature size), and a cell area of about 4F2. Therefore, although the channel length may be scaled using a planar transistor in which a gate electrode is formed over a semiconductor substrate and a junction region is formed at both sides of the gate electrode, it is difficult to satisfy these size requirements. In order to solve the above-mentioned problem, a vertical channel transistor structure has recently been proposed.

However, a vertical channel transistor structure according to the related art causes a floating body effect in which a body is electrically separated from the silicon substrate by a source/drain junction region located at a lower end of a vertical gate as the line width of the device is reduced. If the floating body effect occurs, the cell threshold voltage of the transistor is lowered by a hole over the body, which results in deterioration of the refresh properties of the semiconductor device.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to a semiconductor device including a vertical gate and a method for manufacturing the same, which prevents a floating body phenomenon, thereby increasing a cell threshold voltage and reducing leakage current, resulting in improved refresh properties of the semiconductor device.

In accordance with an aspect of the present invention, a plurality of pillar patterns, including first pillar patterns arranged along a first direction and second pillar patterns arranged along a second direction, formed over a semiconductor substrate; a gate extending in the first direction, arranged along sidewalls of the first pillar patterns, and configured to couple the first pillar patterns; a junction region formed in an upper portion of the pillar patterns; and a conductive line arranged along the sidewalls of the first pillar patterns and provided in a region disposed below the junction region and over the gate.

The device may further include a bit line formed in a lower region between the first pillar patterns, the bit line extending in the second direction, wherein the second direction is perpendicular to the first direction.

The gate and the conductive line are formed as lines, and wherein the gate and the conductive line extend in the first direction.

The conductive line is formed of a p-type polysilicon layer.

The device may further include a p-type junction region formed in a region of the pillar patterns that is coupled to the conductive line.

The conductive line is spaced apart from a top surface of the gate by a predetermined distance.

The conductive line is spaced apart from a bottom surface of the junction region by a predetermined distance.

The junction region is an n-type junction region.

The device may further include further comprising a storage node formed over the pillar patterns and coupled to the junction region.

In accordance with another aspect of the present invention, a method for manufacturing a semiconductor device, includes forming a plurality of pillar patterns, including first pillar patterns arranged along a first direction and second pillar patterns arranged along a second direction, by etching a semiconductor substrate; forming a gate extending in the first direction, disposed over sidewalls of the first pillar patterns, and configured to couple the first pillar patterns; forming a conductive line disposed over the gate and arranged along the sidewalls of the first pillar patterns; and forming a first junction region in an upper portion of the pillar patterns, a lower surface of the first junction region being disposed at a higher level than an upper surface of the conductive line.

The method may further include forming a bit line conductive material over the semiconductor substrate including the pillar patterns; and etching the bit line conductive material to form a bit line in a lower region between the first pillar patterns, the bit line extending in the second direction, wherein the first direction is perpendicular to the second direction.

The method further comprising forming a first insulating film over a portion of the semiconductor substrate disposed between the first pillar patterns and disposed over the bit line.

The gate includes: forming a gate conductive material over the first insulating film between the first pillar patterns; forming a spacer over the gate conductive material at an upper portion of the sidewalls of the first pillar patterns; and etching the gate conductive material using the spacer as an etch mask.

The method further comprising: forming a gate insulating film over the sidewalls of the first pillar patterns before forming the gate conductive material.

The method further comprising: forming a second insulating film over the portion of the semiconductor substrate disposed between the first pillar patterns and over the gate.

Forming the conductive line includes: forming a polysilicon layer over the pillar patterns and the second insulating film; and etching the polysilicon layer so that the polysilicon layer remains at a predetermined thickness over the insulating film.

The polysilicon layer is a p-type polysilicon layer.

The method further comprising: forming a second junction region in a portion of the pillar patterns coupled to the conductive line by implementing a thermal treatment process.

Forming the first junction region includes implanting n-type ions into an upper surface of the pillar patterns.

Forming a storage node over the pillar patterns after forming the first junction region, the storage node being coupled to the first junction region.

It is to be understood that both the foregoing general description and the following detailed description of the present invention are exemplary and explanatory and are intended to provide further explanation of the invention as claimed.

BRIEF DESCRIPTION OF THE DRAWINGS

FIG. 1(*i*) is perspective view illustrating a semiconductor device according to an embodiment of the present invention. FIG. 1(*ii*) is a cross-sectional view of the semiconductor device of FIG. 1(*i*) taken along X-X'. FIG. 1(*iii*) is a cross-sectional view of the semiconductor device of FIG. 1(*i*) taken along Y-Y'.

DESCRIPTION OF EMBODIMENTS

Figure 2E:
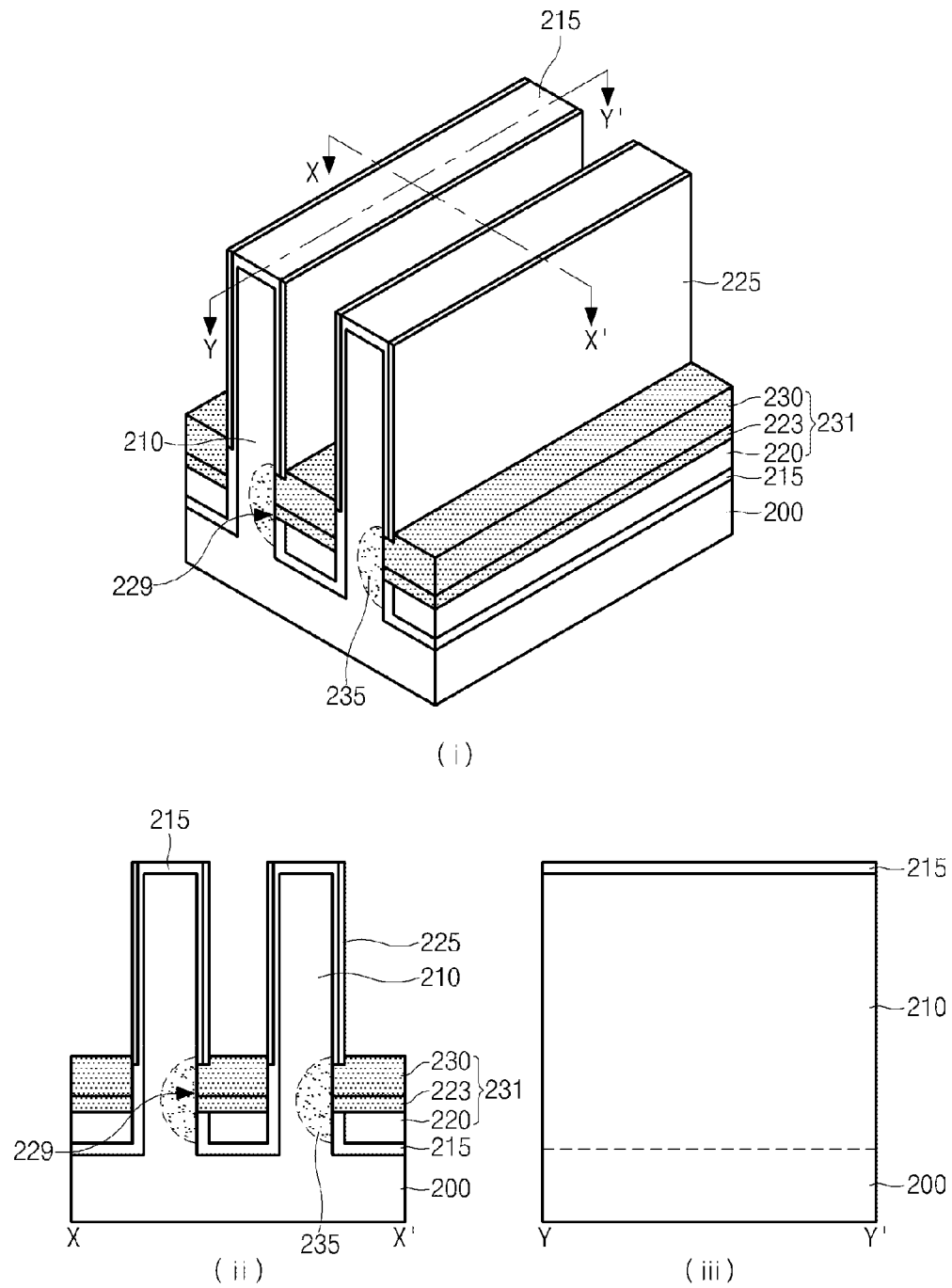
FIGS. 2A to 2Q are perspective and cross-sectional views illustrating a method for manufacturing a semiconductor device according to an embodiment of the present invention.

Reference will now be made in detail to the embodiments of the present invention, examples of which are illustrated in the accompanying drawings. Wherever possible, the same reference numbers will be used throughout the drawings to refer to the same or like parts.

A semiconductor device and a method for manufacturing the same according to the embodiments of the present invention will hereinafter be described with reference to the accompanying drawings.

FIG. 1(*i*) is a perspective view illustrating a semiconductor device according to an embodiment of the present invention. FIG. 1(*ii*) is a cross-sectional view of the semiconductor device of FIG. 1(*i*) taken along X-X'. FIG. 1(*iii*) is a cross-sectional view of the semiconductor device of FIG. 1(*i*) taken along Y-Y'. A semiconductor device according to an embodiment of the present invention, which includes a vertical gate, will hereinafter be described with reference to FIG. 1.

First, a bit line 131 is provided between line patterns 110, which are formed by etching a semiconductor substrate 100. The bit line 131 may extend along the same direction as the line Y-Y'. A plurality of pillar patterns 110*a* are provided over the line patterns 110. The pillar patterns 110*a* are formed by etching the line patterns 110 and are spaced apart from one another by a constant distance. In an embodiment, a gate 143*a* is provided between the pillar patterns 110*a* arranged along the line Y-Y'. The gate 143*a* may be arranged along the line X-X', i.e., in a direction that is perpendicular to the bit line 131. Thus, the gate 143*a* may couple the pillar patterns 110*a* arranged along the line X-X'.

An insulating film 160 is formed in a region between the pillar patterns 110*a* and adjacent gates 143*a* disposed at the sidewalls of the pillar patterns 110*a*. A conductive line 165 is provided over the insulating film 160. Preferably, the conductive line 165 extends in a direction parallel to the gate 143*a*, i.e. along the line X-X', and is formed of p-type polysilicon. Although a body contact is not separately illustrated in the drawing, preferably, a body contact may be coupled to the conductive line 165. A body bias may be applied through the body contact. The location of the body contact is not limited to a specific region, and may be formed in any region where a relatively large space can be secured.

A junction region 173, which will be used as a storage node contact, is provided in an upper region of the pillar patterns 110*a*. A storage node 175 is provided over the pillar patterns 110*a* and is coupled to the junction region 173.

As described above, when applying a bias to the conductive line 165, located between the gate 143*a* and the junction region 173 for a storage node contact 175, it is possible to prevent a floating body effect. This may increase the cell threshold voltage, which is typically very low in a vertical gate, thereby reducing leakage current and improving refresh properties of the semiconductor device.

A method for manufacturing the semiconductor device having the above-described configuration according to an embodiment of the present invention will hereinafter be described with reference to FIGS. 2A to 2Q. Referring first to FIG. 2A, a plurality of line patterns 210, which define a region where a buried bit line will be formed, are formed by etching a semiconductor substrate 200. The line patterns 210 extend along the direction of the line Y-Y'. Next, a first liner insulating film 215 is deposited over a surface of the semiconductor substrate 200 including the line patterns 210. In an embodiment, the first liner insulating film 215 is preferably formed of a material including an oxide film and the thickness of the first liner insulating film 215 is preferably in the range of 80 to 120.

Referring to FIG. 2B, a first bit line conductive layer 220 is formed over the entirety of the resulting structure, including the line patterns 210 over which the first liner insulating film 215 has been formed. In an embodiment, the first bit line conductive layer 220 is preferably formed of any of titanium (Ti), titanium nitride (TiN), cobalt, or a combination thereof, in order to reduce a resistance of the entire bit line. The first bit line conductive layer 220 is etched by an etch-back process, so that the first bit line conductive layer 220 remains only at a bottom region between the line patterns 210.

Next, a second bit line conductive layer 223 is formed over the first liner insulating film 215 and the first bit line conductive layer 220. Preferably, the second bit line conductive layer 223 is formed of a doped polysilicon layer. Subsequently, the second bit line conductive layer 223 is etched by an etch-back process, so that the second bit line conductive layer 223 remains in a lower region between the line patterns 210 and over the first bit line conductive layer 220. Here, the top of the second bit line conductive layer 223 corresponds to a position of the top of a sidewall contact that will be formed in a subsequent process.

Referring to FIG. 2C, portions of the first liner insulating film 215 exposed after the second bit line conductive layer 223 is partially etched and disposed at the sidewalls and the top of each line pattern 210, is partially removed. The partial removal of portions of the first liner insulating film 215 may be achieved by a cleaning process. In an embodiment, about 50% of the initially formed thickness of the first liner insulating film 215 may be removed until about 50% of an initially formed thickness is removed. For example, the thickness of the first liner insulating film 215 remaining after the cleaning process may range from 40 Å to 60 Å. Further, in an embodiment, a portion of the first liner insulating film 215 disposed between the line pattern 210 and a sidewall of the second bit line conductive layer 223 may also be partially removed, depending on the implementation time of the cleaning process. In an embodiment, when a portion of the first liner insulating film 215 located at the sidewall of the second bit line conductive layer 223, it may be removed to a depth ranging from about 250 Å to 300 Å from the top of the second bit line conductive layer 223.

Subsequently, a second liner insulating film 225 is deposited over surfaces of the first liner insulating film 215 and the second bit line conductive layer 223. Preferably, the second liner insulating film 225 is formed of a material including a nitride film. Thereafter, the second liner insulating film 225 disposed over the line patterns 210 and over the second bit line conductive layer 223 is removed by an etch-back process so that the second liner insulating film 225 remains only at the at the sidewalls of each line pattern 210 over the surface of the first liner insulating film 215.

Referring to FIG. 2D, an upper portion of the second bit line conductive layer 223 is etched, so that a portion of the first liner insulating film 215 between the second bit line conductive layer 223 and the second liner insulating film 225 is exposed. Here, the height of the top of the second bit line conductive layer 223 remaining after the etch-back process corresponds to a position of the bottom of the sidewall contact that will be formed in a subsequent process. In an embodiment, it is necessary to maintain a constant etch rate of the second bit line conductive layer 223, in order to prevent the first bit line conductive layer 220 below the second bit line conductive layer 223 from being exposed.

Referring to FIG. 2E, a sacrificial conductive film (not shown) is formed to expose a bottom portion of the first liner insulating film 215 and the second liner insulating film 225 present at one sidewall of each line pattern 210. A portion of the first liner insulating film 215 is removed to expose a portion of one sidewall of the line pattern 210. The exposed line pattern 210 forms a sidewall contact 229. Since the first liner insulating film 215 is formed of an oxide based material and the second liner insulating film 225 is formed of a nitride based material, the second liner insulating film 225 may remain rather than being removed.

Subsequently, a third bit line conductive layer 230 is formed over the entirety of the resulting structure, including the line patterns 210 at which the sidewall contacts 229 have been formed. Preferably, the third bit line conductive layer 230 is formed of the same material as the second bit line conductive layer 223, i.e. a doped polysilicon layer. Thereafter, the third bit line conductive layer 230 is partially etched by an etch-back process, so that the third bit line conductive layer 230 remains over the second bit line conductive layer 223 in a lower region between the line patterns 210, so as to form a buried bit line 231.

Next, ions are implanted into the second bit line conductive layer 223 and the third bit line conductive layer 230 of the buried bit line 231, so that a bit line junction region 235 is formed in each line pattern 210. In an embodiment, the bit line junction region 235, formed via the sidewall contact 229 that is formed only at one side of the line pattern 210, extends along the length of the line pattern in the direction of the line Y-Y'.

Figure 2F:
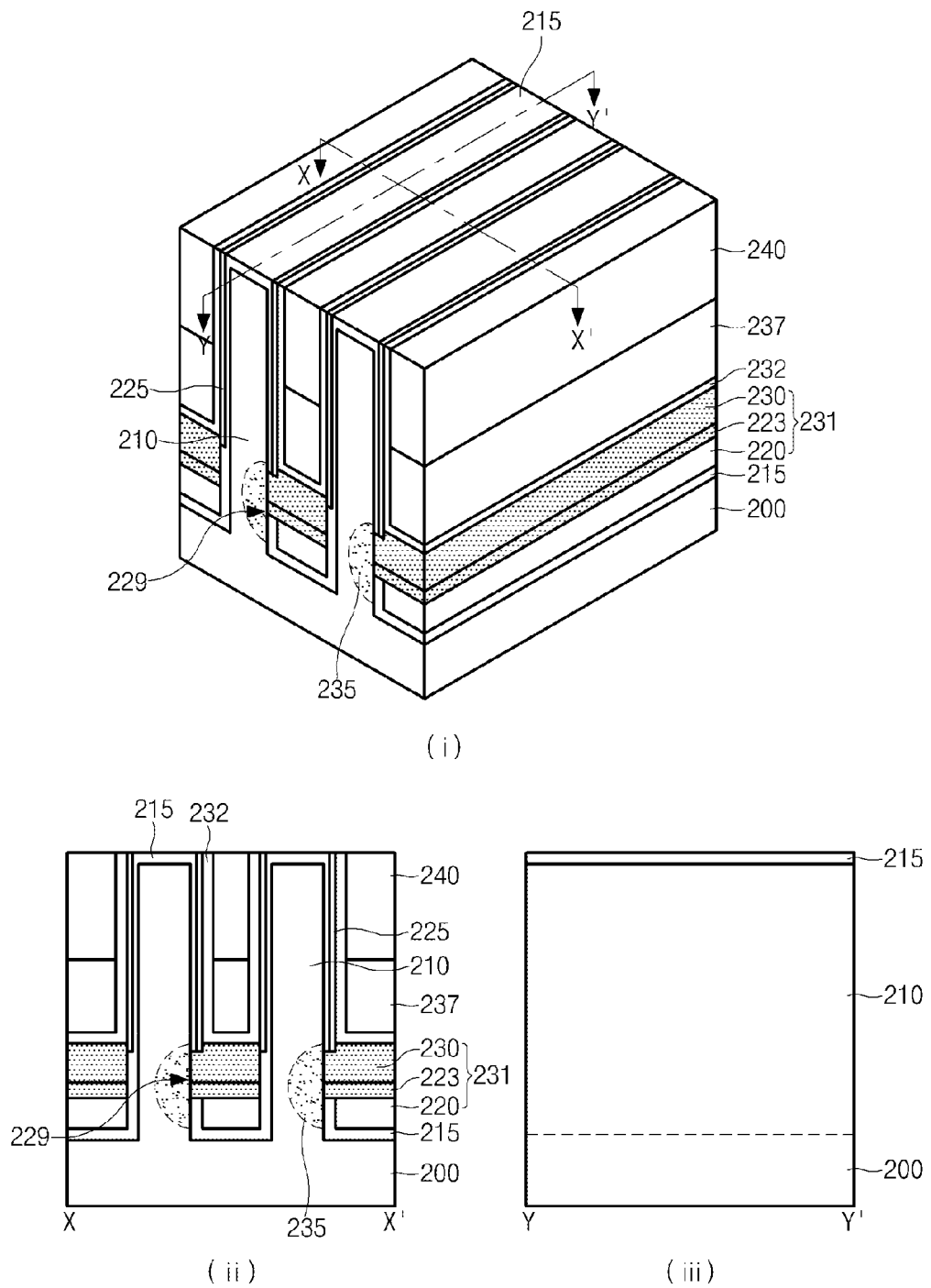

Next, referring to FIG. 2F, a capping layer 232 is deposited over the entire surface including the line patterns 210 and the third bit line conductive layer 230. Then, a first insulating film 237 is formed over the entirety including the line patterns 210 over which the capping layer 232 has been formed, Thereafter, a planarization process is implemented until the first liner insulating film 215 disposed over a top surface of the line patterns 210 is exposed. The first insulating film 237 is further etched by an etch-back process, so that the capping layer 232 disposed over a lateral surface of an upper portion of each line pattern 210 is exposed. In an embodiment, the first insulating film 237 is formed of an oxide film, for example, a Spin On dielectric (SOD) film, having excellent burying properties.

Next, after a second insulating film 240 is formed over the first insulating film 237, a planarization process is implemented until the first liner insulating film 215 disposed over a top surface of each line pattern 210 is exposed. The second insulating film 240 may be formed of a nitride film. The first insulating film 237, formed of an oxide film, is formed below the second insulating film 240, formed of a nitride film, because the difference in etch selectivity between a silicon layer and an oxide film is greater than the difference in etch selectivity between a silicon layer and a nitride film. This difference in etch selectivity may be utilized in a subsequent process of etching the line patterns 210, i.e. the silicon layer.

Referring to FIG. 2G, a mask pattern 242 defining a vertical gate is formed over the second insulating film 240 and the line patterns 210. Preferably, the mask pattern 242 is configured in the form of a line, and extends in the same direction as the line X-X', which is perpendicular to the buried bit line 231.

Referring to FIG. 2H, an upper portion of each line pattern 210, the second insulating film 240, and a portion of the first insulating film 237 are etched using the mask pattern 242 as an etch mask, to form pillar patterns 210a. Then, the mask pattern 242 is removed.

Figure 2I:
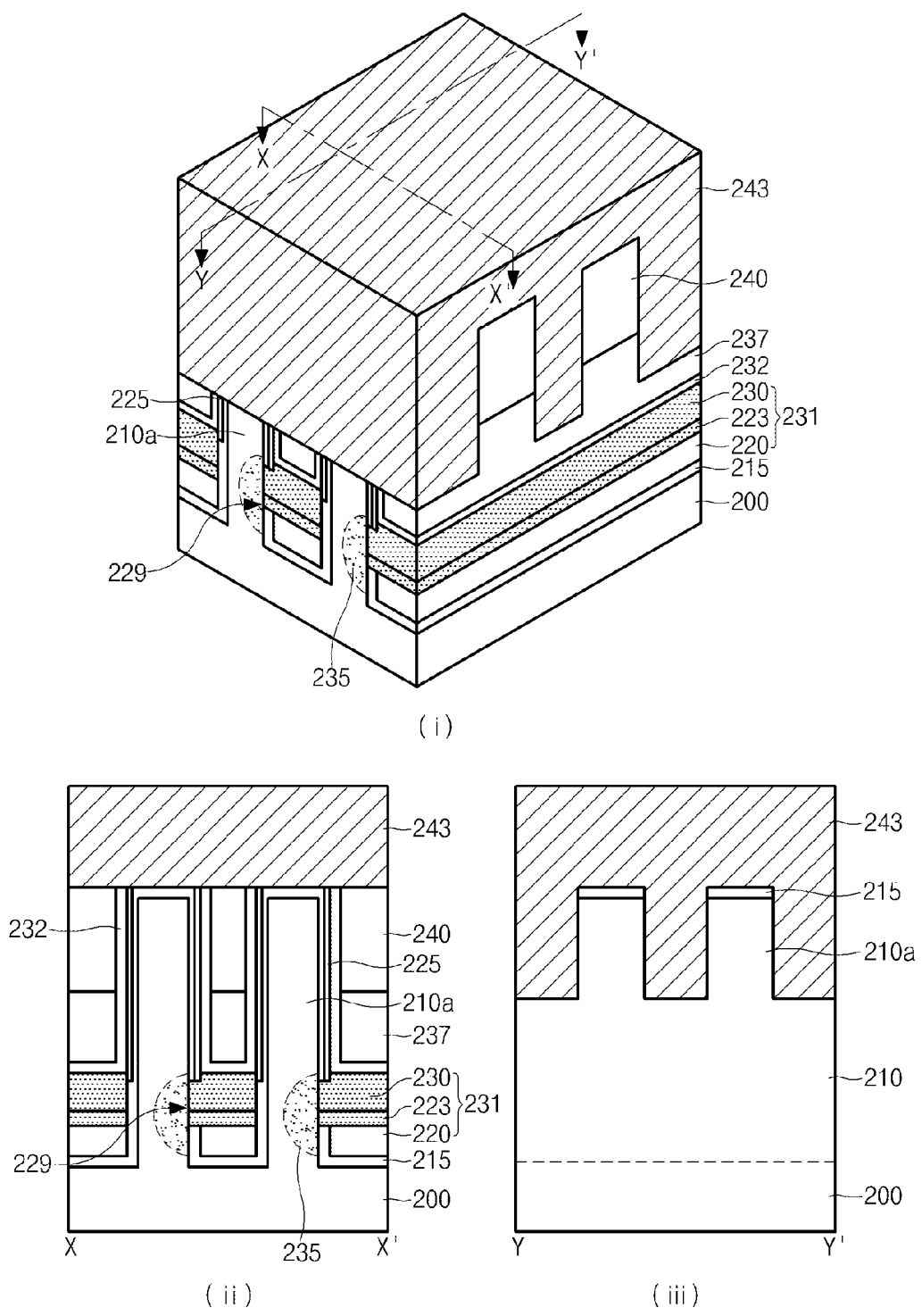

Referring to FIG. 2I, a gate insulating film (not shown) is formed over surfaces of the first insulating film 237 and the pillar patterns 210a. Also, a gate conductive material 243 is formed over the entire resulting structure, including the gate insulating film. The gate conductive material 243 may be formed of any of a titanium nitride film, tungsten, or a combination thereof. In an embodiment, assuming that the gate conductive material 243 is formed of a titanium nitride film, it is preferable that the source gas be $TiCl_4$, TDMAT(Ti(N$[CH_3]_2)_4$), or a combination thereof. In another embodiment, assuming that the gate conductive material 243 is formed of tungsten, it is preferable that the source gas be $WF_6$, $B_2BH_6$, $H_2$, or $SiH_4$ and that Chemical Vapor Deposition (CVD) equipment for a thermal treatment be used.

In an embodiment, the gate conductive material 243 may be in the form of a liner and may be formed only over a surface of the gate insulating film (not shown). If the gate conductive material 243 is configured in the form of a liner as described above, a subsequent spacer etching process may be omitted.

Referring to FIG. 2J, an etch-back process is implemented so that the gate conductive film 243 having a predetermined thickness remains over the first insulating film 237 and between the pillar patterns 210a. Then, a spacer material is deposited over the entire structure including the pillar patterns 210a and the gate conductive film 243. Next, an etch-back process is implemented to form a spacer 250 over the surface of the gate insulating film (not shown) disposed over the sidewalls of each pillar pattern 210a. The spacer material may be formed of any of an oxide film, a nitride film, or a combination thereof. Preferably, a nitride film and an oxide film are sequentially formed to form the spacer material. In an embodiment, the thickness of the spacer material may correspond to a width of a gate that will be formed in a following process.

Referring to FIG. 2K, the gate conductive film 243 is etched using the spacer 250 as an etch mask, so that a gate 243a is formed at the sidewall of each pillar pattern 210a. Subsequently, after removing the spacer (not shown), a capping layer 255 is formed over the gate 243a and the surface of the sidewalls of pillar pattern 210a. Preferably, the capping layer 255 is formed of a nitride film.

Figure 2L:
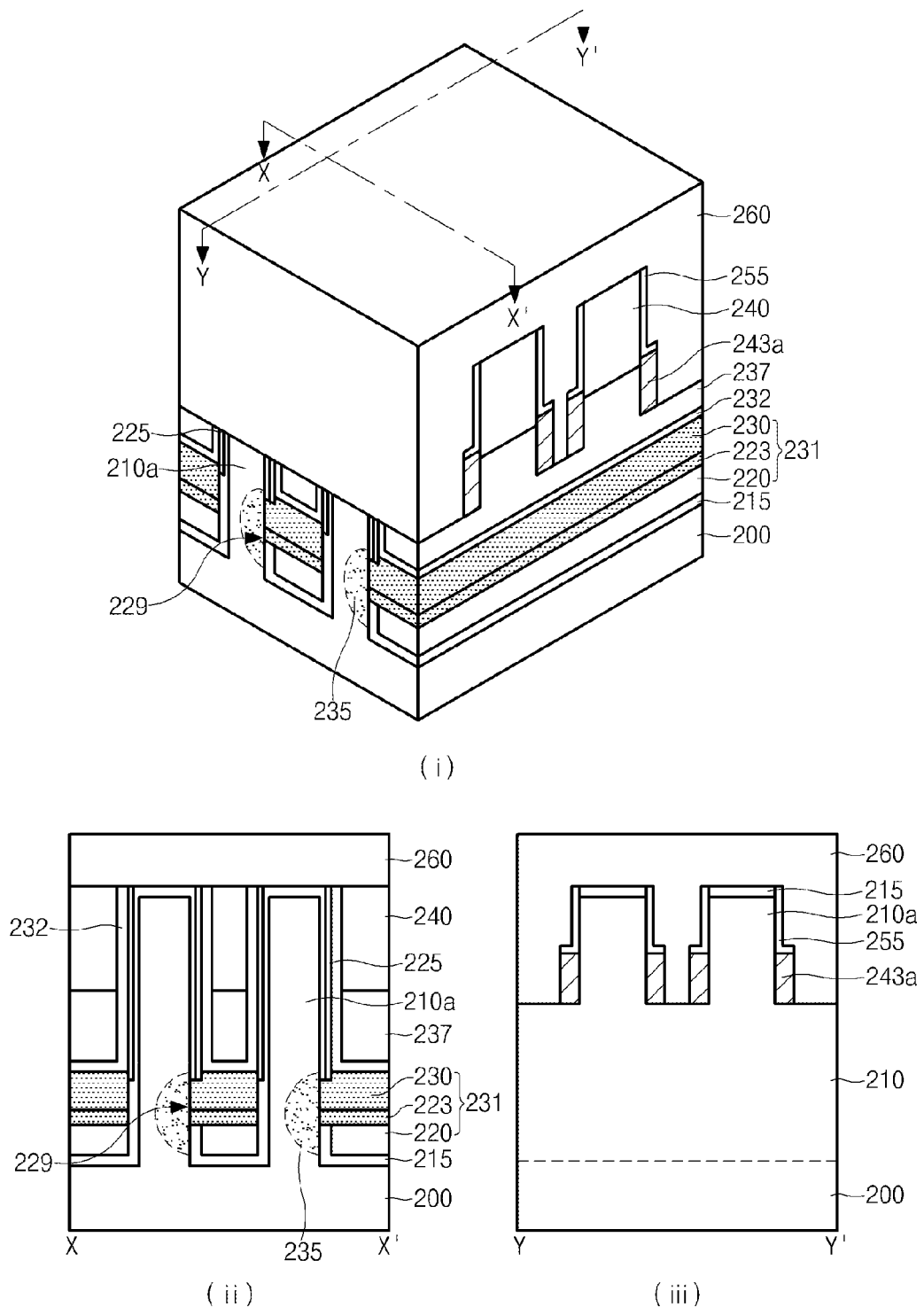

Referring to FIG. 2L, a third insulating film 260 is formed over the first insulating film 237, the gate 243a, and the capping layer 255. The third insulating film 260 may be formed of any of an oxide film, a nitride film, or a combination thereof.

Figure 2M:
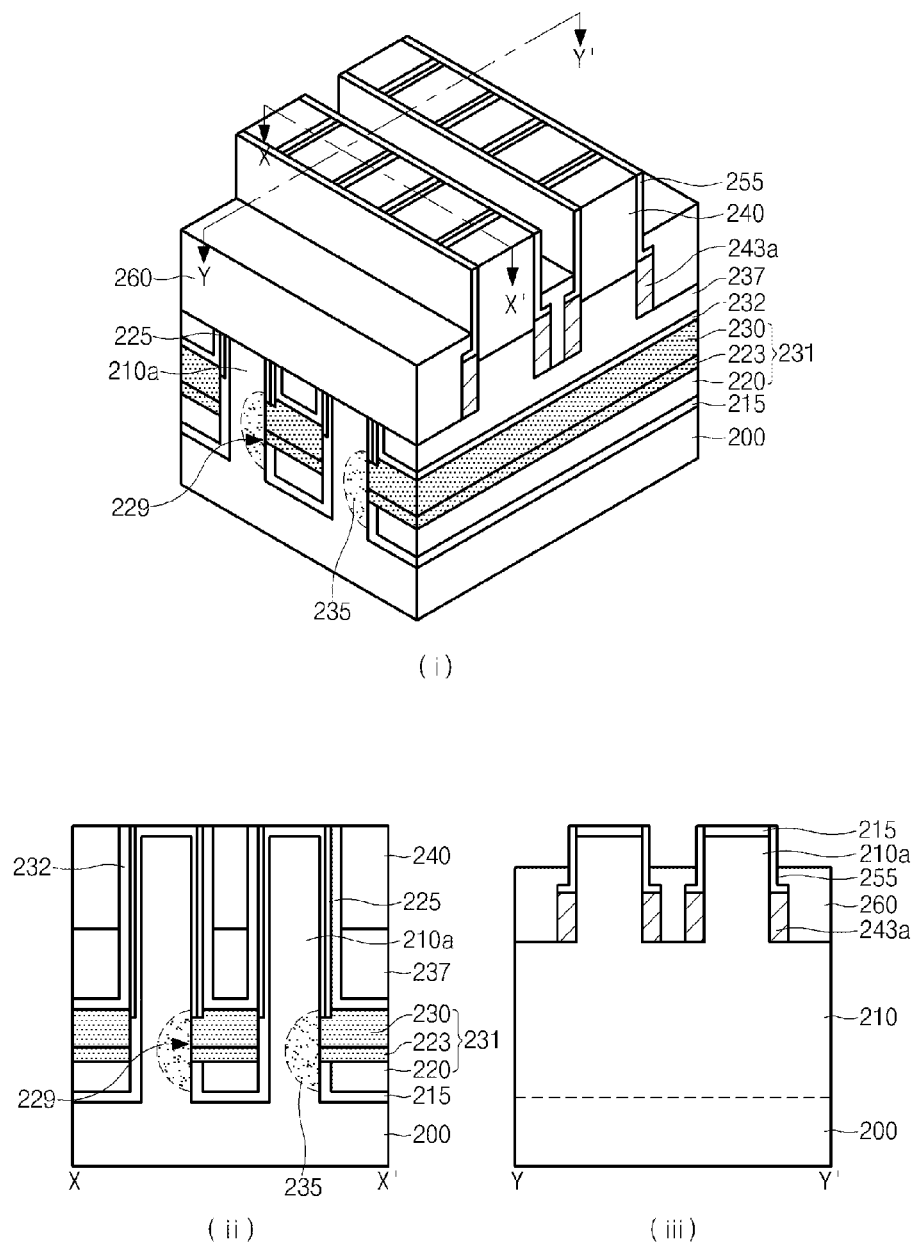

Referring to FIG. 2M, an upper portion of the third insulating film 260 is etched by an etch-back process, so that an upper portion of each pillar pattern 210a protrudes. In an embodiment, the third insulating film 260 preferably may be etched to a depth that is within a range that ensures that the gate 243a is not exposed.

Figure 2N:
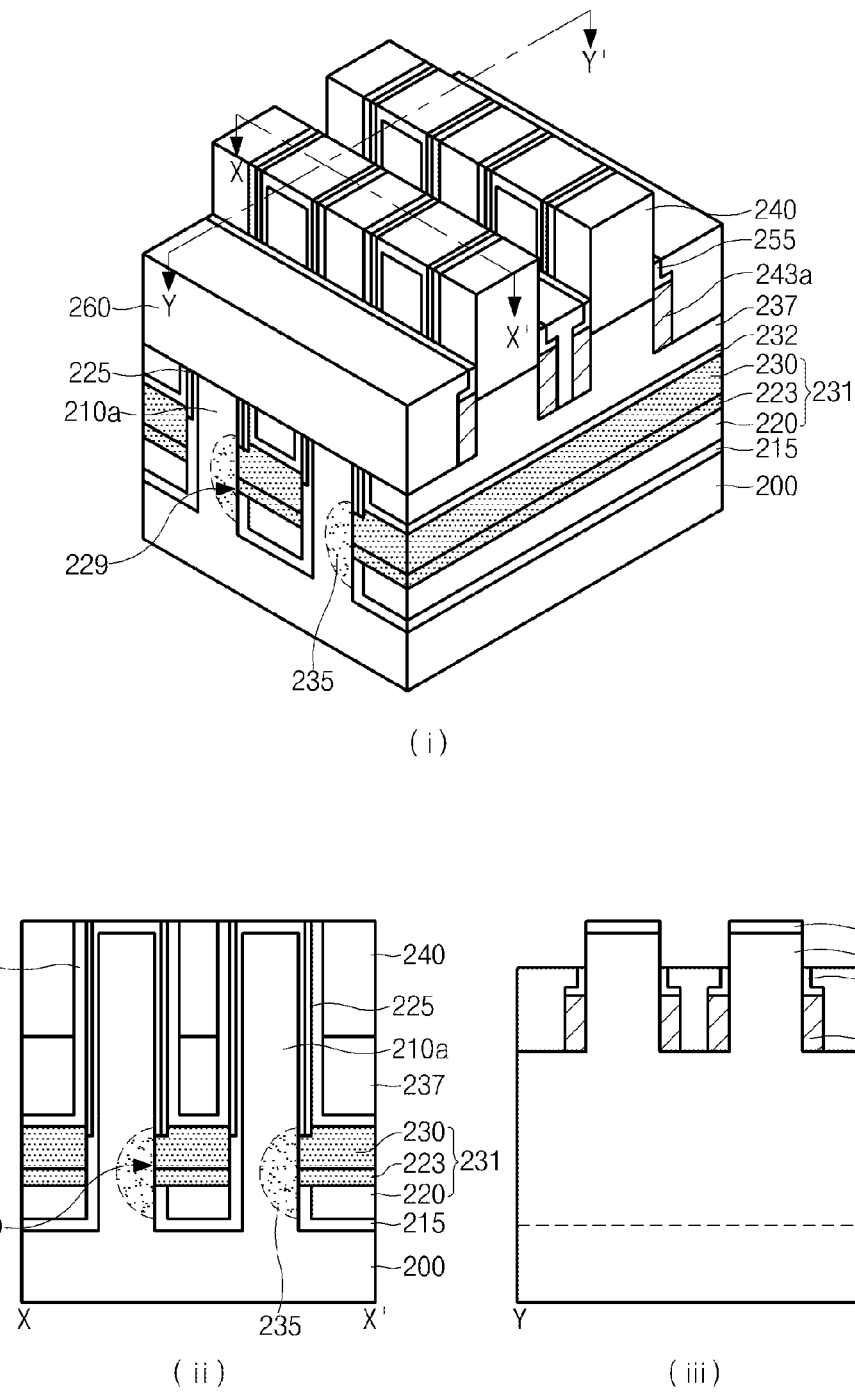

Referring to FIG. 2N, portion of the capping layer 255, exposed after the etch-back process is performed on the third insulating film 260, is removed. The capping layer 255 may be removed by a wet etching method. The wet etching method may be implemented using, e.g., a phosphoric acid solution. As the capping layer 255 is removed, a silicon layer of the pillar pattern 210a is exposed.

Referring to FIG. 2O, a conductive layer is formed over the entire resulting structure, including the third insulating film 260. In an embodiment, the conductive layer is preferably a p-type polysilicon layer. Next, a planarization process is implemented to etch the conductive layer until the upper portion of each pillar pattern 210a protrudes. Thereafter, the conductive layer may be further etched, so that the conductive layer remains at a predetermined thickness over the third insulating film 260 between the pillar patterns 210a. The remaining conductive layer is referred to as a conductive line 265.

When p-type ions of the conductive line 265 are moved to the pillar pattern 210a, which comes into contact with the conductive line 265, a p-type junction region is formed (not shown). The p-type junction region may be formed by implementing a thermal treatment process with respect to the conductive line 265. The thermal treatment process may be implemented after a storage node contact is formed in a subsequent process. As a result of forming the conductive line 265 using the p-type polysilicon layer described above, it is possible to apply a body bias to the p-type semiconductor substrate. Although a body contact is not separately illustrated in the drawings, preferably a body contact is coupled to the conductive line 265 and a body bias is applied through the body contact. The location of the body contact is not limited to a specific region, and may be formed in any region where a relatively large space can be secured.

Referring to FIG. 2P, a fourth insulating film 270 is formed over the entire resulting structure including the conductive line 265. Thereafter, a planarization process is implemented until an upper surface of each pillar pattern 210a is exposed. Then, ions are implanted into the exposed upper surface of the pillar pattern 210a, to form storage node junction regions 273, which will serve as storage node contacts. In an embodiment, the storage node junction regions 273 are formed by implanting n-type ions. A thermal treatment process may be implemented to form the storage node junction regions 273. During the thermal treatment process, the p-type ions of the previously formed conductive line 265 may move into the pillar patterns 210a.

Figure 2Q:
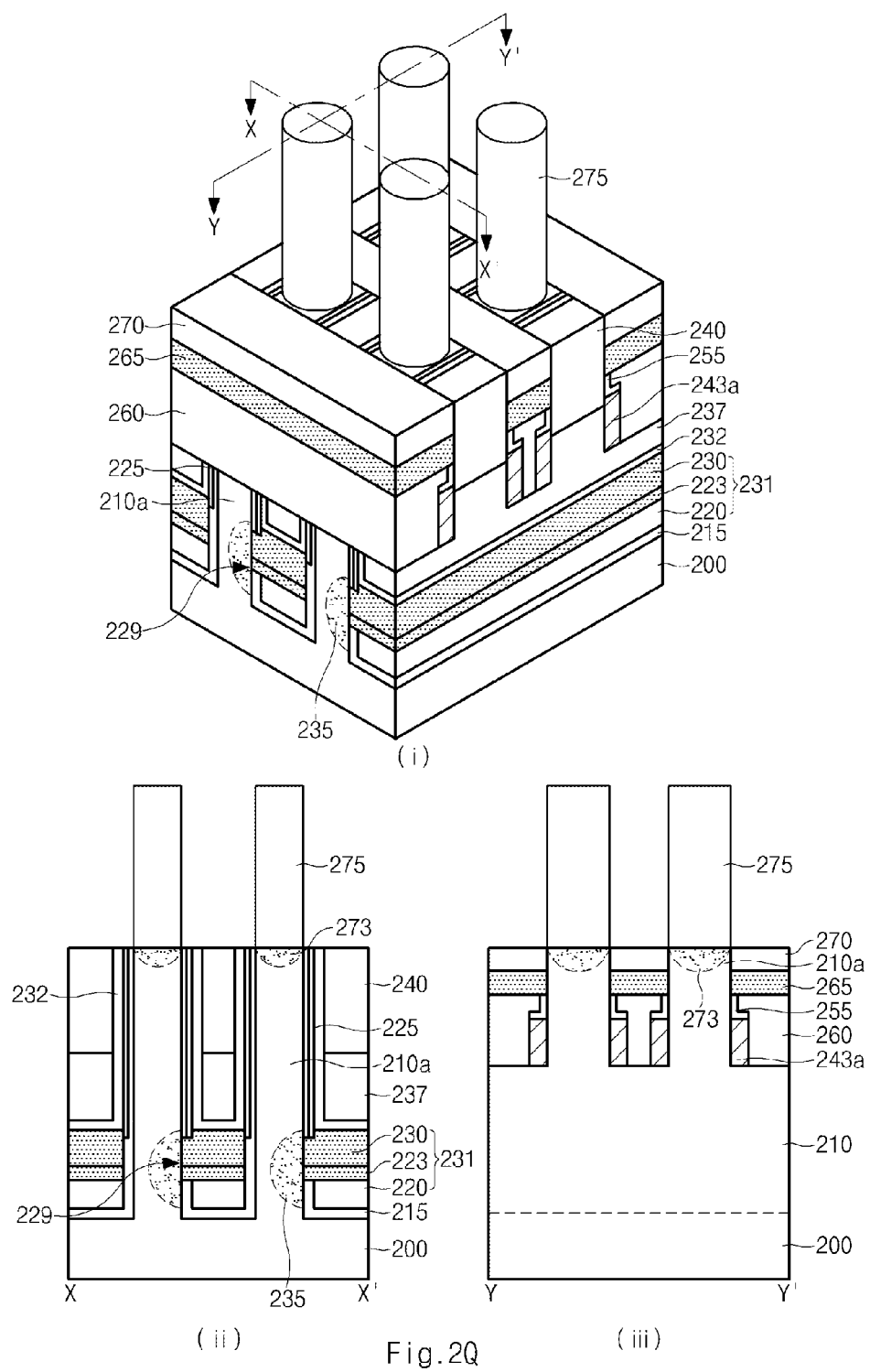

Referring to FIG. 2Q, storage nodes 275 coupled to the storage node junction regions 273 are formed over the pillar patterns 210a. The storage nodes 275 may have a cylinder shape or a concave shape, but are not limited thereto.

As is apparent from the above description, according to an embodiment of the present invention, the conductive line 265, formed of a p-type polysilicon layer, is formed between the vertical gate and the storage node junction region 273, and a bias is applied to the conductive line 265 to remove a hole formed in the pillar pattern 210a. This configuration can prevent a floating body phenomenon. As a result, a cell threshold voltage, which is very low in a vertical gate, can be increased via a body bias, and leakage current can be reduced, resulting in improved refresh properties of the device.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
   a plurality of pillar patterns, including first pillar patterns arranged along a first direction and second pillar patterns arranged along a second direction, formed over a semiconductor substrate;
   a gate extending in the first direction, arranged along sidewalls of the first pillar patterns, and coupling the first pillar patterns;
   a junction region disposed in an upper portion of the pillar patterns; and
   a conductive line extending in the first direction and disposed directly on sidewalls of the first pillar patterns, the conductive line provided in a region laterally adjacent to the junction region,
   wherein a bottom surface of the conductive line is disposed above a top surface of the gate,
   wherein the gate is not electrically coupled to the conductive line, and,
   wherein the conductive line removes a hole formed in the first pillar patterns and the second pillar patterns.

2. The semiconductor device according to claim 1, further comprising a bit line formed in a lower region between the first pillar patterns, the bit line extending in the second direction,
   wherein the second direction is perpendicular to the first direction.

3. The semiconductor device according to claim 1, wherein the gate and the conductive line are formed as lines, and wherein the gate and the conductive line extend in the first direction.

4. The semiconductor device according to claim 1, wherein the conductive line is formed of a p-type polysilicon layer.

5. The semiconductor device according to claim 1, further comprising a p-type junction region formed in a region of the pillar patterns that is coupled to the conductive line.

6. The semiconductor device according to claim 1, wherein the conductive line is spaced apart from a top surface of the gate by a predetermined distance.

7. The semiconductor device according to claim 1, wherein the conductive line is spaced apart from a bottom surface of the junction region by a predetermined distance.

8. The semiconductor device according to claim 1, wherein the junction region is an n-type junction region.

9. The semiconductor device according to claim 1, further comprising a storage node formed over the pillar patterns and coupled to the junction region.

10. The semiconductor device according to claim 1, further comprising a capping layer extending in the first direction,
    wherein the capping layer is disposed between the top surface of the gate and the bottom surface of the conductive line.

11. The semiconductor device according to claim 10, wherein the capping layer has an L-shaped cross-section.

12. The semiconductor device according to claim 10, wherein the capping layer has an L-shaped cross-section, and wherein a bottom surface of the capping layer is in direct contact with the top surface of the gate and a top surface of the capping layer is in direct contact with the bottom surface of the conductive line.

13. The semiconductor device according to claim 1, wherein a sidewall of the conductive line is in direct contact with the sidewalls of the first pillar patterns.

* * * * *